United States Patent

Zhou et al.

Patent Number: 5,838,207
Date of Patent: Nov. 17, 1998

[54] VOLTAGE CONTROLLED OSCILLATOR WITH PARTIAL LOAD-PULL TUNING

[75] Inventors: Xue-Song Zhou, Chapel Hill; Scott Richard Justice, Durham, both of N.C.

[73] Assignee: Ericsson Inc., Research Triangle Park, N.C.

[21] Appl. No.: 770,889

[22] Filed: Dec. 20, 1996

[51] Int. Cl.$^6$ ...................................................... H03B 5/12
[52] U.S. Cl. .................................. 331/36 C; 331/117 R; 331/177 V
[58] Field of Search ............................. 331/36 C, 117 R, 331/117 FE, 177 R, 177 V, 116 R, 116 FE

[56] References Cited

U.S. PATENT DOCUMENTS

| | | | |
|---|---|---|---|
| 3,581,239 | 5/1971 | Knutson | 331/116 R |
| 4,520,326 | 5/1985 | Clemens | 331/116 R |
| 4,749,962 | 6/1988 | Doornenbal | 331/17 |
| 5,105,162 | 4/1992 | Fleissner et al. | 331/177 V |
| 5,107,228 | 4/1992 | Pham et al. | 331/177 R |
| 5,444,422 | 8/1995 | Mycynek | 331/116 R |
| 5,512,862 | 4/1996 | Avanic et al. | 331/117 D |

Primary Examiner—Siegfried H. Grimm
Attorney, Agent, or Firm—David C. Hall

[57] ABSTRACT

A voltage controlled oscillator has an active circuit, a resonant circuit coupled to the input node of the active circuit and an adjustable impedance circuit coupled to an output node of the active circuit. The impedance of the adjustable impedance circuit may be altered to tune the oscillation frequency of the oscillator. In one embodiment, the adjustable impedance circuit includes a varactor diode in series with a capacitor and means for varying the voltage across the varactor diode. An isolation circuit is coupled to an output node of the active circuit. In one embodiment, the isolation circuit is connected to a different output node than the adjustable impedance circuit is connected to.

11 Claims, 5 Drawing Sheets

VOLTAGE CONTROLLED OSCILLATOR WITH PARTIAL LOAD-PULL TUNING

BACKGROUND

1. Field of Invention

The present invention relates in general to electronic oscillators and in particular to a voltage controlled oscillator with partial load-pull tuning for use in phase-locked synthesizers suitable for radio-frequency communication systems. The oscillator is operable over a wide frequency range with extremely low phase noise.

2. Description of Related Art

Oscillators are commonly used in the art to generate stable oscillatory signals. A typical oscillator circuit comprisesan amplifier, a frequency selective network, and a feedback path. Signals of the selected frequency are amplified and fed back into the circuit. Under appropriate conditions, the output of the circuit will oscillate at the selected frequency.

In a tuned oscillator, the frequency of oscillation may be varied by means of a control signal, such as a control voltage. The voltage controlled oscillator (VCO) is an integral part of the phase-locked loop circuit. The phase-locked loop is well known in the art and is widely used as a frequency synthesizer in a communication system.

The performance of an oscillator when used in an RF communication system may be characterized by a number of attributes, including tuning range, spectral purity, and frequency stability. Frequency stability includes a number of related aspects, one of which is freedom from phase noise.

Phase noise may be understood by reference to a mathematical sinusoid. The output waveform of an ideal oscillator should conform to an ideal mathematical sinusoid. In practice, however, the output waveform deviates from the ideal. This deviation generates frequency instability. Phase noise is the term used to describe frequency instability introduced by random departures of the waveform zero crossings of the actual oscillator from the zero-crossings of an ideal sinusoid. This effect may be observed on an oscilloscope, and results in random jittering of the waveform's phase angle.

Phase noise generated by a VCO within a phase-locked frequency synthesizer imposes fundamental limitations on the performance of an associated RF transceiver in three ways:

1) The signal output by the transmitter may not meet spectral mask constraints imposed by regulatory agencies.

2) The receiver may have insufficient adjacent channel suppression due to the appearance of a faux local-oscillator signal corresponding to spectral energy attributable to the presence of phase noise.

3) The points of the modulation constellation move in response to the magnitude of the error vector, which leads to an increase in decoding errors by the receiver. See, e.g., "Identifying RF-related Impairments," *Microwave Journal,* March 1996, pp. 88–94.

Phase noise is related to the Q (or quality factor) of the frequency selective network, which may comprise a resonant circuit. The quality factor Q is a measure of the maximum energy stored per cycle to the energy dissipated per cycle in the resonant circuit. The lower the Q of the resonant circuit, the more phase noise will be present in the output waveform. Known circuit configurations for tuned oscillators alter the impedance of the resonant circuit by coupling a tuning circuit to the resonant circuit. The tuning circuit typically includes an input voltage and a varactor. The capacitance of the varactor is altered in response to changes in the tuning voltage. However, coupling the tuning circuit to the resonant circuit lowers the Q of the resonant circuit, which leads to an increase in phase noise.

In response to these concerns, a number of solutions have been developed, none of which is fully satisfactory.

One solution is to mix the output of the synthesizer's main VCO with a spectrally pure signal generated by a separate, crystal-controlled oscillator. This mixing lowers the frequency of the input to the synthesizer's divide-by-N circuit and thereby reduces the value of N required in the divider. As a consequence, the phase noise at the output of the VCO (and thus the synthesizer) is reduced. The principal disadvantages of this approach are its cost and complexity. This approach also has drawbacks relating to the size, weight and heat generation characteristics of the transceiver.

Another solution taught in the prior art is to reduce the bandwidth of the synthesizer's feedback loop filter and thereby reduce the phase noise present in the synthesizer's output waveform. This approach reduces the frequency agility of the synthesizer, however, as the feedback loop filter is critically important in determining the synthesizer's agility (i.e. ability to change frequencies quickly). Narrowing the bandwidth of the feedback loop filter increases the synthesizer's settling time, lessening the synthesizer's ability to change frequency responsively.

Thus, there is a need in the art for an improved voltage controlled oscillator with reduced phase noise that may be implemented in a simple, inexpensive circuit. The reduction in phase noise will ideally be accomplished without a corresponding loss of frequency agility.

SUMMARY OF THE INVENTION

Accordingly, it is an object of the present invention to provide an improved voltage controlled oscillator having reduced phase noise.

It is an object of the invention to provide an improved VCO with phase noise reduced without undue complexity or expense.

It is a further object of the invention to provide a voltage controlled oscillator which is tuned by means of partial load pull tuning.

It is a further object of the invention to provide an improved VCO with reduced phase noise for use in a phase-locked frequency synthesizer.

The foregoing objects are accomplished in a voltage controlled oscillator with partial load-pull tuning. The oscillator has a resonant circuit, an active circuit, and anadjustable impedance load. The impedance of the adjustable impedance load is altered by means of a tuning voltage.

These and other objects of the invention, together with features and advantages thereof will become apparent from the following detailed specification when read with the accompanying drawings in which like reference numerals refer to like elements.

DETAILED DESCRIPTION

An improved electronic voltage controlled oscillator (VCO) circuit is shown and described. In particular, the improved VCO will be described with reference to its function as an element of a phase-locked frequency synthesizer. However, those skilled in the art will recognize that the VCO of the present invention is not limited to use within a phase-locked frequency synthesizer. Rather, the invention may be used advantageously in any device in which it is desired to have a low-cost, low complexity VCO with improved phase noise characteristics. Thus, the present invention may be employed in a number of different circuits without departing from the scope of the invention.

In the present invention, phase noise reduction is accomplished by increasing the quality factor Q of the oscillator's resonant circuit. The increase in Q diminishes the phase noise present in the output of the VCO relative to the phase noise produced by known VCO's.

Figure 1:
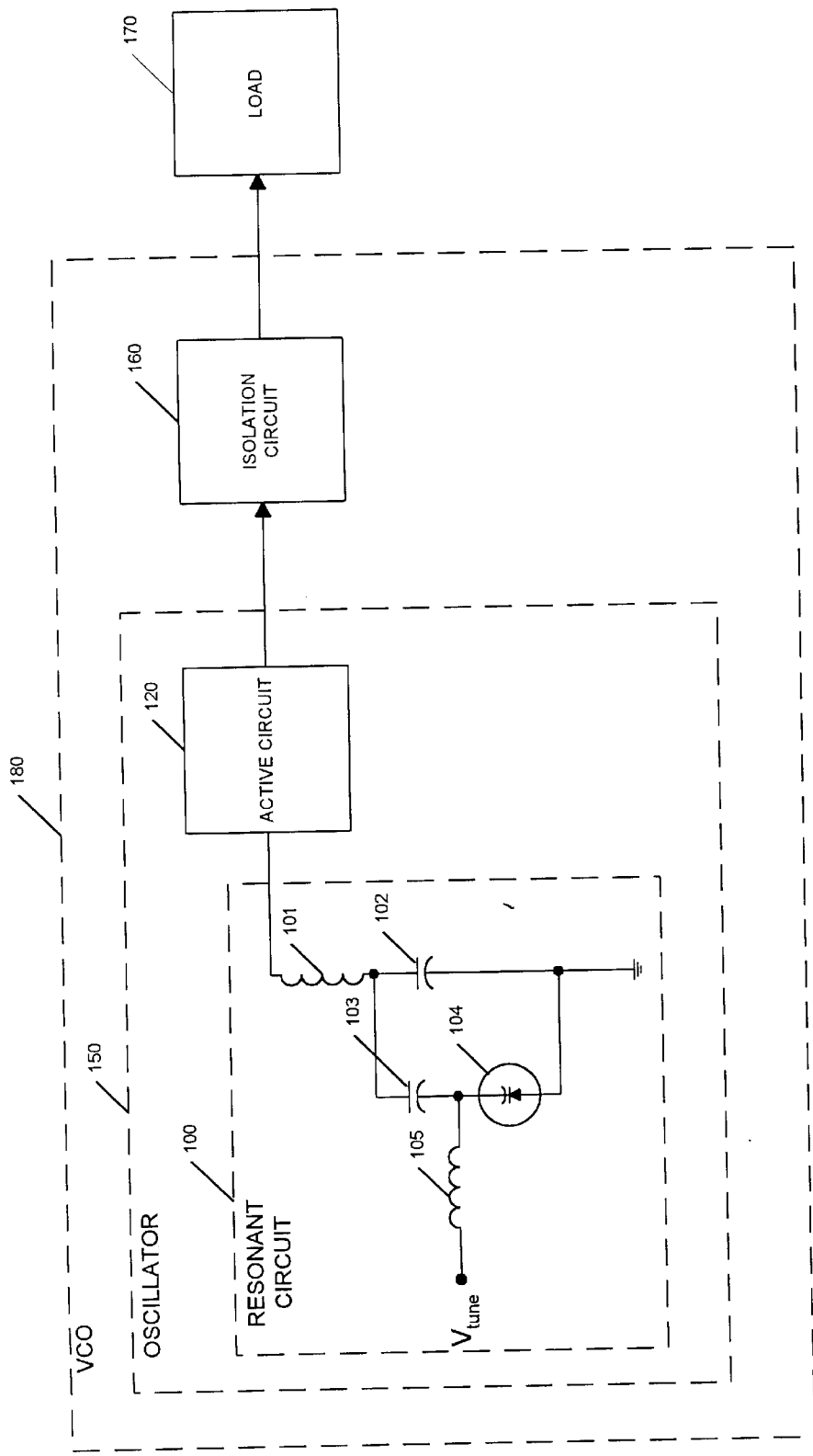
FIG. 1 is a partial block diagram showing a known oscillator circuit.

The improvement in Q attributable to the present invention is most readily explained by reference to FIG. 1, which illustrates a known VCO circuit. FIG. 1 shows a series-tuned oscillator 150 having a number of constituent blocks. Oscillator 150 includes a resonant circuit 100 and an active circuit 120. The output of active circuit 120 is fed into an isolation circuit 160 of conventional design. The output of isolation circuit 160 is used to drive a load 170.

Isolation circuit 160 may be a passive isolator or an active buffer or amplifier such as an emitter follower implemented in bipolar technology or a source follower implemented in FET technology, as are well known in the art. The purpose of the isolation circuit is to isolate the oscillator 150 from changes in the impedance of load 170. The prior art teaches explicitly that such isolation is needed in order to prevent changes in the impedance of the load 170 from being reflected back into the oscillator 150.

The resonant frequency of resonant circuit 100 is determined by the inductance of an inductor 101, together with the net capacitance provided by a capacitor 102, a blocking capacitor 103, and a varactor diode 104. The capacitance of varactor diode 104 varies in response to changes in a DC bias voltage denoted $V_{tune}$ in FIG. 1. The bias voltage $V_{tune}$ is coupled to the varactor diode through an inductor 105. The inductance of inductor 105 is selected so that inductor 105 acts as an RF choke. As the bias voltage $V_{tune}$ changes, the capacitance of the varactor 104 changes, causing the resonant frequency of the resonant circuit 100 to change. Thus, by varying the bias voltage $V_{tune}$, the oscillator 150 is caused to oscillate at a different frequency.

Resonant circuit 100 is connected to active circuit 120. In practice, the elements of circuit 120 might be part of a larger ASIC chip having other functions as well. Together, resonant circuit 100 and active circuit 120 form oscillator 150. Oscillator 150 and isolation circuit 160 together form VCO 180.

Although the VCO circuit 180 illustrated in FIG. 1 accomplishes its primary purpose (i.e., to provide an oscillatory signal at a selected frequency) the presence of capacitor 103, varactor diode 104 and inductor 105 lowers the Q of the resonant circuit 100. To the extent that the Q of the resonant circuit 100 is lowered, the phase noise generated by the VCO 180 is increased.

Figure 2A:
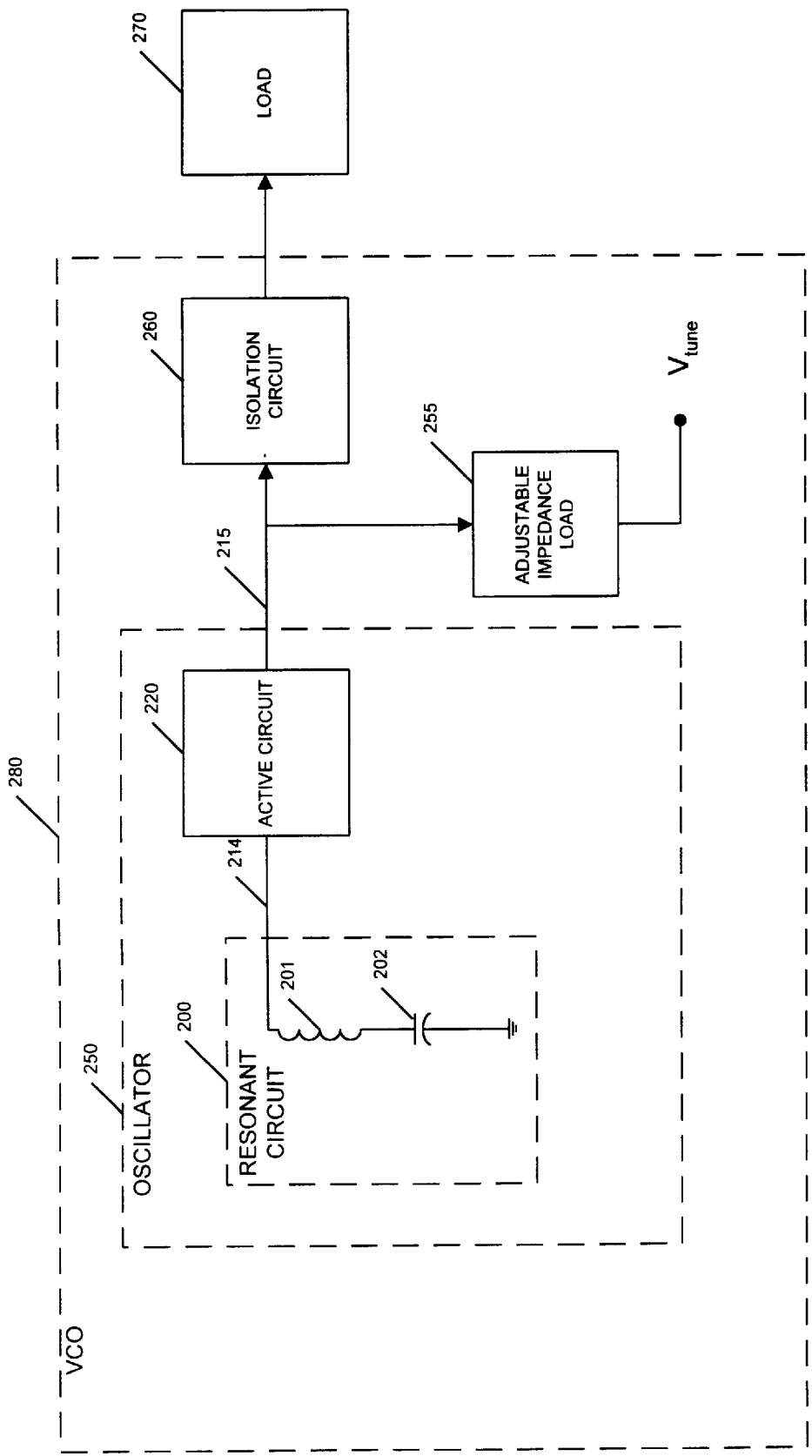
FIG. 2A is a partial block diagram showing an embodiment of the present invention.
Figure 2B:
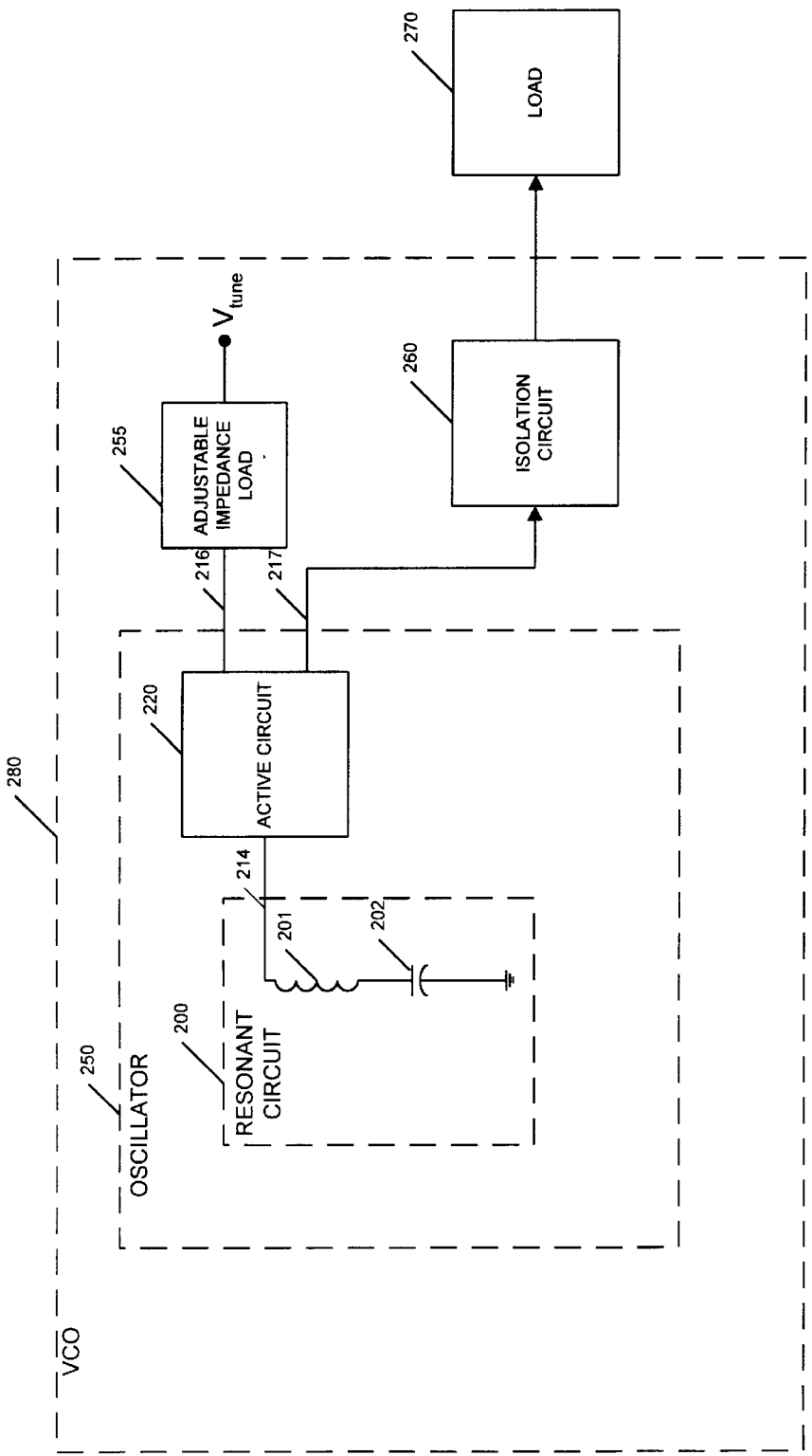
FIG. 2B is a partial block diagram showing another embodiment of the present invention.

FIGS. 2A and 2B illustrate an improved VCO according to the present invention. Referring to FIG. 2A, an active circuit 220 is connected to a resonant circuit 200, which comprises inductor 201 and capacitor 202. Together, active circuit 220 and resonant circuit 200 comprise oscillator 250. The output of oscillator 250 is carried by a line 215, which is connected to an adjustable impedance load 255 and to an isolation circuit 260. The output of isolation circuit 260 is coupled to a load 270. As described with respect to FIG. 1, the function of isolation circuit 260 is to isolate the oscillator 250 from the impedance of load 270.

The impedance of the adjustable impedance load 255 is adjustable by means of a DC tuning voltage, $V_{tune}$. As the impedance of the adjustable impedance load 255 is deliberately changed by adjusting the value of $V_{tune}$, the oscillation frequency of oscillator 250 changes, and the oscillator 250 is thereby tuned to the desired frequency. Thus, notwithstanding the presence of isolation circuit 260, an adjustable impedance load is presented to the output of the oscillator 250 and is used to tune oscillator 250. This arrangement is referred to herein as "load-pull tuning." Since the output of the oscillator is used to drive an adjustable impedance load 255 along with a load 270 (via isolation circuit 260), the instant arrangement may also be referred to as "partial load-pull tuning." (The term "partial" refers to the fact that only part of the load driven by the oscillator 250 is used to tune the oscillator.)

Since the adjustable impedance load 255 is connected to the output of oscillator 250 and used to tune oscillator 250, there is no need to incorporate impedance altering elements such as capacitor 103, varactor 104 and inductor 105 in resonant circuit 200. Thus, the Q of resonant circuit is determined only by the values of inductor 201 and capacitor 202 and is not adversely affected by the presence of additional elements.

Since the Q of resonant circuit 200 is not impaired, oscillator 250, adjustable impedance load 255 and isolation circuit 260 form a VCO 280 having improved phase-noise performance relative to VCOs taught in the prior art.

FIG. 2B illustrates a second embodiment of the present invention. As in FIG. 2A, FIG. 2B shows an active circuit 220 connected to a resonant circuit 200, which comprises inductor 201 and capacitor 202. Active circuit 220 and resonant circuit 200 together form oscillator 250. The output of oscillator 250 is coupled to isolation circuit 260 via line 217. Line 217 is selected as a connection point for isolation circuit 260 to provide better power isolation. The output of isolation circuit 260 drives load 270. Adjustable impedance load 255 is coupled to oscillator 250 by means of line 216, which provides a separate connection point to oscillator 250 from line 217.

Figure 3:
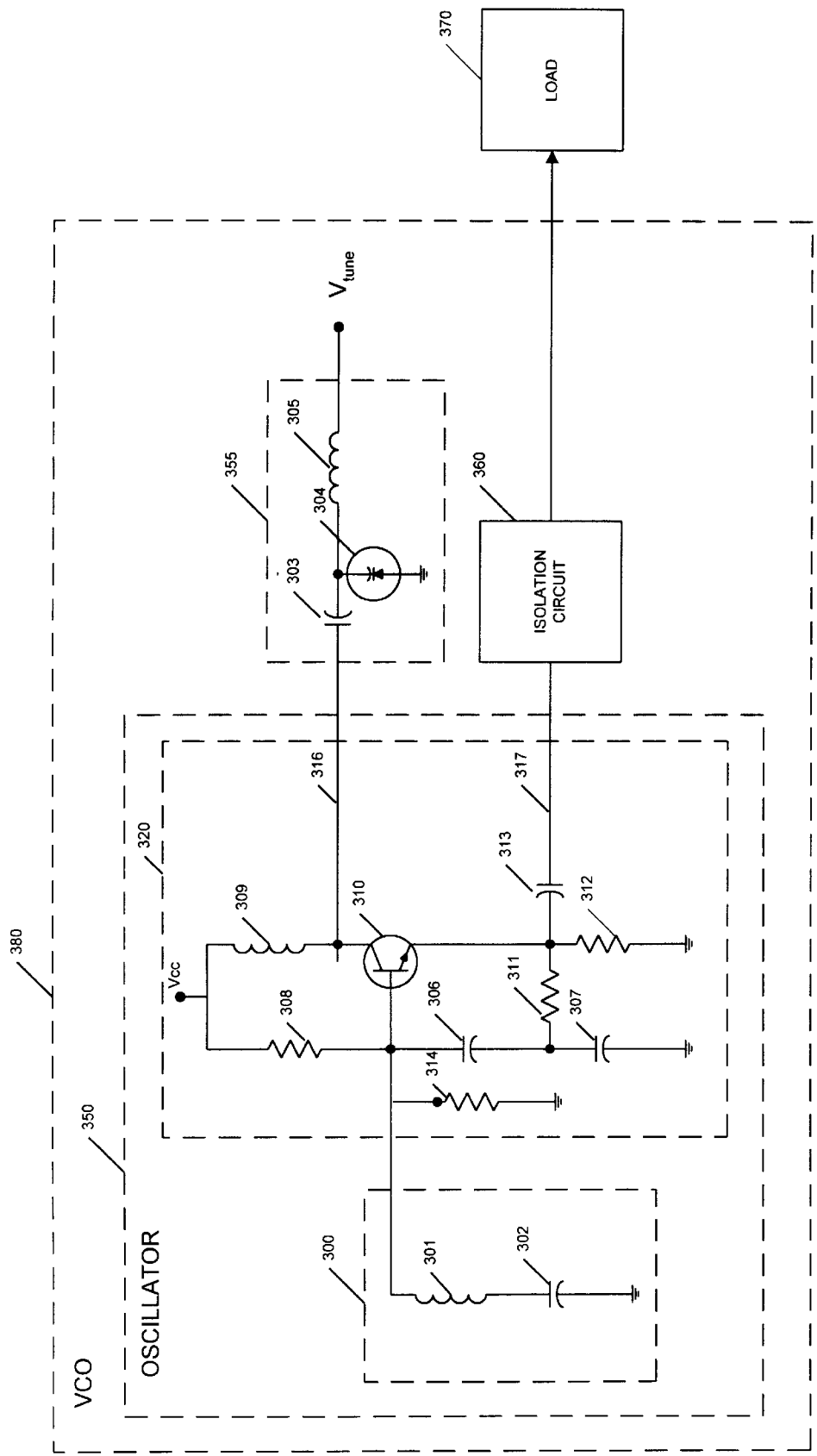
FIG. 3 is a schematic diagram of the embodiment of FIG. 2B.

FIG. 3 illustrates a preferred embodiment of the present invention as implemented in a series-tuned Colpitts oscillator. However, it will be appreciated by those skilled in the art that the present invention may be implemented in other kinds of oscillator circuits, and is not limited to the exemplary configuration.

As shown in FIG. 3, resonant circuit 300 is coupled to active circuit 320. Active circuit 320 comprises a Colpitts oscillator having a transistor 310 which, in the illustrated embodiment, is an NPN-type transistor of conventional design. A voltage $V_{cc}$ is applied to the collector of transistor 310 through inductor 309. The inductance of inductor 309 is selected such that inductor 309 functions as an RF choke.

The operating point of transistor 310 is biased by means of resistor 308, resistor 314, and resistor 312. Capacitor 306, capacitor 307, and resistor 311 provide a positive feedback path for the circuit.

In a preferred embodiment, the elements of the circuit of FIG. 3 have the values shown in Table 1.

TABLE 1

Circuit Element Values

| Circuit element | Value |
| --- | --- |
| Inductor 301 | 12 nH |
| Capacitor 302 | 4.7 pF |
| Capacitor 303 | 15 pF |
| Varactor 304 | 2 pF–10 pF |
| Inductor 305 | 1 μH |
| Capacitor 306 | 4.7 pF |
| Capacitor 307 | 3.3 pF |
| Resistor 308 | 5.1 kΩ |
| Inductor 309 | 3 nH |
| Resistor 311 | 5 Ω |
| Resistor 312 | 200 Ω |
| Capacitor 313 | 3 pF |
| Resistor 314 | 15 kΩ |

Resonant circuit 300 includes an inductor 301 and a capacitor 302, and is coupled to the base of transistor 310. Together, resonant circuit 300 and active circuit 320 form oscillator 350.

Adjustable impedance load 355 is coupled to the collector of transistor 310 via line 316, which comprises a first output node of active circuit 320. Adjustable impedance load 355 comprises capacitor 303, inductor 305 and varactor diode 304. Inductor 305 functions as an RF choke. A tuning voltage $V_{tune}$ is applied to the adjustable impedance load 355 through inductor 305. As $V_{tune}$ changes, the capacitance of varactor diode 304 changes. This change in load impedance causes the oscillation frequency of oscillator 320 to change.

Isolation circuit 360 is coupled to the emitter of transistor 310 through capacitor 313 and line 317. Line 317 forms a second output node of active circuit 320. The capacitance of capacitor 313 is selected to adjust power delivered to the isolation circuit 360. The output of isolation circuit 360 drives a load 370.

Adjustable impedance load 355 is connected via the first output node 316 to the collector of transistor 310, while the output waveform is taken from the second output node 317, which is coupled to the emitter of transistor 310. This arrangement provides additional power isolation than would be the case if the adjustable impedance load 355 and the actual load 370 were attached at the same node on the oscillator 350.

Together, oscillator 350, isolation circuit 360 and adjustable impedance load 355 form VCO 380.

Figure 4:
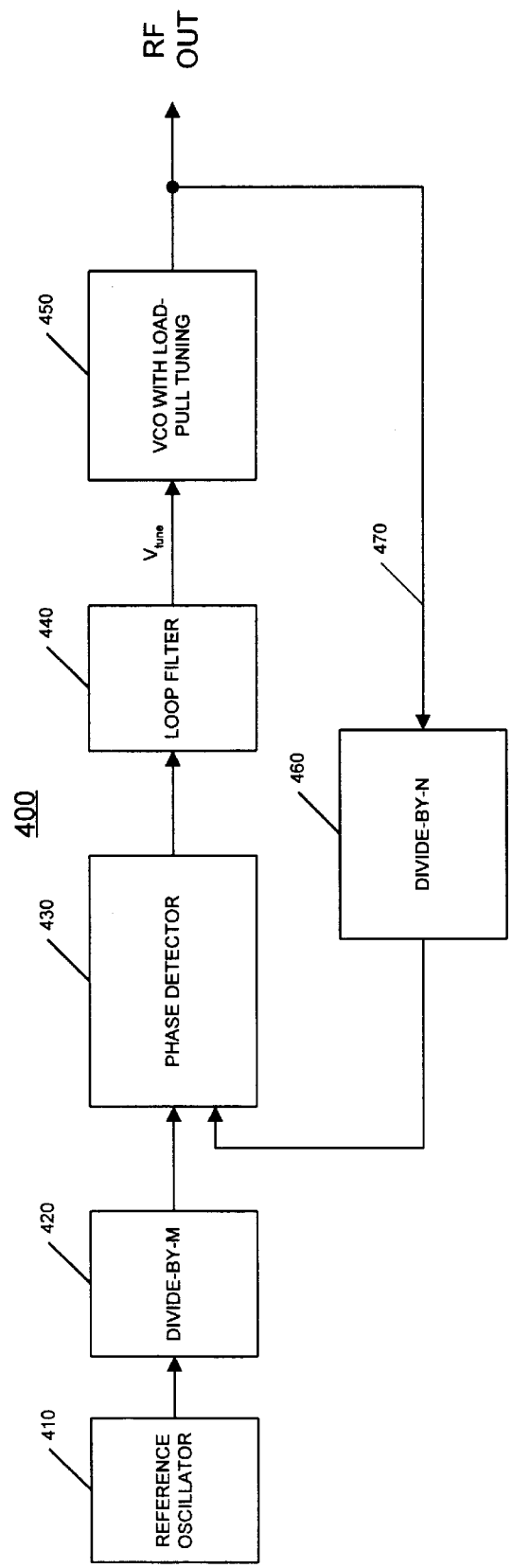
FIG. 4 is a block diagram of a phase-locked loop circuit including the improved oscillator of the present invention.

FIG. 4 illustrates an application of the present invention in a phase-locked frequency synthesizer 400. Synthesizer 400 includes a reference oscillator 410, a divide-by-M circuit 420, a phase detector 430, a loop filter 440, a VCO with partial load-pull tuning 450 according to the present invention, a divide-by-N circuit 460, and a feedback path 470.

Reference oscillator 410 provides a stable waveform having a predetermined frequency of oscillation $f_{ref}$. In one embodiment, reference oscillator 410 may be a temperature compensated crystal oscillator (TCXO) or an oven-controlled crystal oscillator (OCXO). The output of reference oscillator 410 is fed into divide-by-M circuit 420 which produces an output waveform having a frequency of oscillation equal to $f_{ref}/M$. The output of the divide-by-M circuit 420 is fed into phase detector 430.

VCO 450 generates a waveform having a frequency of $f_0$. The output of VCO 450 is fed into divide-by-N circuit 460. The output waveform of the divide-by-N circuit 460, which has a frequency of oscillation equal to $f_0/N$, is fed into the phase detector 430 by means of feedback path 470.

Phase detector 430 compares the phases of the signals output from divide-by-M circuit 420 and divide-by-N circuit 460 and generates a voltage signal proportional to the phase difference between the two waveforms. This voltage signal is passed through loop filter 440. The output of loop filter 440 is fed into VCO 450 as $V_{tune}$, which is used to tune VCO 450. Thus, by selecting appropriate values for M and N, VCO 450 is caused to oscillate at a stable, predetermined frequency that has a fixed relationship to the oscillation frequency of the reference oscillator 410.

While the present invention has been described herein in detail in relation to its preferred embodiment, it is also understood that this disclosure is only illustrative and exemplary of the present invention and is made merely for purpose of providing a full and enabling disclosure of the invention. Accordingly, it is intended that the invention be limited only by the spirit and scope of the claims appended hereto.

What is claimed is:

1. A voltage controlled oscillator having a characteristic frequency of oscillation, comprising:

an active circuit having an input node, a first output node and a second output node, wherein said active circuit includes a transistor having a collector, a base and an emitter, the emitter of said transistor is coupled to the second output node of said active circuit, and a positive feedback network is provided between the input node and the second output node of said active circuit;

a resonant circuit coupled to the input node of said active circuit;

an adjustable impedance circuit coupled to the first output node of said active circuit, wherein said adjustable impedance circuit is operative to selectively alter the frequency of oscillation of said voltage controlled oscillator; and an isolation circuit coupled to the second output node of said active circuit.

2. The voltage controlled oscillator of claim 1, wherein said adjustable impedance circuit includes a voltage controlled capacitance and means for varying the voltage across said voltage controlled capacitance.

3. The voltage controlled oscillator of claim 2, wherein said voltage controlled capacitance includes a varactor diode.

4. The voltage controlled oscillator of claim 3, wherein said varactor diode is connected in series with a capacitor.

5. The voltage controlled oscillator of claim 1, wherein said active circuit includes a Colpitts oscillator.

6. The voltage controlled oscillator of claim 1, wherein said adjustable impedance circuit is coupled through a capacitor to the emitter of said transistor.

7. The voltage controlled oscillator of claim 1, wherein the resonant circuit is coupled to the base of said transistor.

8. The voltage controlled oscillator of claim 1, wherein the impedance of said adjustable impedance circuit is altered in response to a tuning voltage applied to said adjustable impedance circuit.

9. The voltage controlled oscillator of claim 8, wherein the impedance of said adjustable impedance circuit is selectively adjustable to a desired impedance.

10. A phase-locked frequency synthesizer, comprising:

a reference oscillator for generating a reference waveform;

a voltage controlled oscillator for generating an output waveform; and a phase detector, responsive to said reference waveform and said output waveform, for generating a voltage signal proportional to the phase difference between said reference waveform and said output waveform;

wherein the voltage signal is used to tune said voltage controlled oscillator; and wherein the voltage controlled oscillator includes (a) an active circuit having an input node, a first output node and a second output node, wherein said active circuit includes a transistor having a collector, a base and an emitter, the emitter of said transistor is coupled to the second output node of said active circuit, and a positive feedback network is provided between the input node and the second output node of said active circuit; (b) a resonant circuit coupled to the input node of said active circuit; and (c) an adjustable impedance circuit coupled to the first output node of said active circuit, wherein said adjustable impedance circuit is operative to selectively alter the frequency of oscillation of said voltage controlled oscillator.

11. A voltage controlled oscillator for generating an oscillatory output signal having a characteristic frequency of oscillation, comprising:

an active circuit having an input node and first and second output nodes;

a resonant circuit coupled to the input node of said active circuit, said resonant circuit being characterized by a quality factor Q defining the ratio of the maximum energy stored per cycle to the energy dissipated per cycle for said resonant circuit; and a circuit having an adjustable impedance coupled to the first output node of said active circuit, wherein said adjustable impedance circuit is operative to selectively alter the frequency of oscillation of said voltage controlled oscillator, and wherein the Q of said resonant circuit is unaffected by changes in the impedance of said adjustable impedance circuit, wherein said active circuit includes a transistor having a collector, a base and an emitter, and wherein the emitter of said transistor is coupled to the second output node of said active circuit.

* * * * *